(12) United States Patent
Gao et al.

(10) Patent No.: US 9,277,211 B2
(45) Date of Patent: Mar. 1, 2016

(54) BINARIZATION SCHEME FOR INTRA PREDICTION RESIDUALS AND IMPROVED INTRA PREDICTION IN LOSSLESS CODING IN HEVC

(71) Applicant: Futurewei Technologies, Inc., Plano, TX (US)

(72) Inventors: Wen Gao, West Windsor, NJ (US); Minqiang Jiang, Campbell, CA (US); Haoping Yu, Carmel, IN (US)

(73) Assignee: Futurewei Technologies, Inc., Plano, TX (US)

( * ) Notice: Subject to any disclaimer, the term of this patent is extended or adjusted under 35 U.S.C. 154(b) by 233 days.

(21) Appl. No.: 13/868,050

(22) Filed: Apr. 22, 2013

(65) Prior Publication Data

US 2013/0279569 A1     Oct. 24, 2013

Related U.S. Application Data

(63) Continuation-in-part of application No. 13/866,468, filed on Apr. 19, 2013.

(60) Provisional application No. 61/636,409, filed on Apr. 20, 2012.

(51) Int. Cl.
| | | |
|---|---|---|
| *H04N 11/02* | (2006.01) | |
| *H04N 19/103* | (2014.01) | |
| *H03M 7/40* | (2006.01) | |
| *H04N 19/91* | (2014.01) | |

(52) U.S. Cl.
CPC ....... *H04N 19/00018* (2013.01); *H03M 7/4031* (2013.01); *H04N 19/91* (2014.11)

(58) Field of Classification Search
USPC .................................. 375/240.01–240.29
See application file for complete search history.

(56) References Cited

U.S. PATENT DOCUMENTS 5,764,374 A     6/1998    Seroussi et al.

FOREIGN PATENT DOCUMENTS

JP     20090049969 A     3/2009

OTHER PUBLICATIONS

Zhou, M., "AHG19: Method of frame-based lossless coding mode," Texas Instruments Inc., USA, Feb. 4, 2012, JCTVC-H0083, pp. 1-9.
Bross, B., et al., "High efficiency video coding (HEVC) text specification draft 6," Joint Collaborative Team on Video Coding (JCT-VC) of ITU-T SG16 WP3 and ISO/IEC JTC1/SC29/WG11, 8th Meeting: San Jose, California, Feb. 1-10, 2012, JCTVC-H1003, pp. 1-259.
Gao, W., et al., "AHG13: Improved Binarization Scheme for Intra Luma Prediction Residuals in Loseless Coding," Joint Collaborative Team on Video Coding (JCT-VC) of ITU-T SG 16, WP3 and ISO/IEC JTC 1/SC29/WG11, 9th Meeting: Geneva, CH, JCTVC-I0311, Apr. 27-May 7, 2012, 4 pages.

(Continued)

*Primary Examiner* — Dave Czekaj
*Assistant Examiner* — Leron Beck
(74) *Attorney, Agent, or Firm* — Conley Rose, P.C.; Grant Rodolph; William H. Dietrich

(57) ABSTRACT

A method including adaptively updating a value of an Exponential-Golomb (EG) parameter according to a value of an encoded prediction residual value, and encoding a prediction residual value in a lossless mode using an EG code based on the value of the EG parameter.

22 Claims, 13 Drawing Sheets

(56) References Cited

OTHER PUBLICATIONS

Teuhola, J., "A Compression Method for Clustered Bit-Vectors," Information Processing Letters, Amsterdam, NL, vol. 7, No. 6, XP-001000934, Oct. 6, 1978, pp. 308-311.

Wienberger, M., et al., "LOCO-I: A Low Complexity, Context-Based, Lossless Image Compression Algorithm," Data Compression Conference, Los Alamitos, CA, Mar. 31-Apr. 3, 1996, pp. 140-149.

Wienberger, M., et al., "The LOCO-I Lossless Image Compression Algorithm: Principles and Standardization into JPEG-LS," IEEE Transactions on Image Processing, vol. 9, No. 8, Aug. 1, 2000, pp. 1309-1324.

Foreign Communication From a Counterpart Application, PCT Application PCT/US2013/037663, International Search Report dated Aug. 1, 2013, 4 pages.

Foreign Communication From a Counterpart Application, PCT Application PCT/US2013/037663, Written Opinion dated Aug. 1, 2013, 8 pages.

Bross, B., et al., "WD5: Working Draft 5 of High-Efficiency Video Coding," Joint Collaborative Team on Video Coding (JCT-VC) of ITU-T SG16 WP3 and ISO/IEC JTC1/SC29/WG11, 7th Meeting: Geneva, CH, Nov. 21-30, 2011, JCTVC-G1103_d0, pp. 1-215.

Chang, C., et al., "Enhancement Algorithm for Nonlinear Context-Based Predictors," IEE Proceedings: Vision. Image and Signal Processing, Institution of Electrical Engineers, vol. 150, No. 1, Feb. 20, 2003, pp. 15-19.

Zhou, M., "AHG19: Method of frame-based lossless coding mode for HEVC," Joint Collaborative Team on Video Coding (JCT-VC) of ITU-T SG16 WP3 and ISO/IEC JTC1/SC29/WG11, 8th Meeting: San Jose, California, Feb. 1-10, 2012, JCTVC-H0083, pp. 1-14.

Foreign Communication From a Counterpart Application, PCT Application PCT/US2013/037376, International Search Report dated Jul. 17, 2013, 4 pages.

Foreign Communication From a Counterpart Application, PCT Application PCT/US2013/037376, Written Opinion dated Jul. 17, 2013, 7 pages.

Partial English Translation and Abstract of Japanese Patent Application No. JPA2009049969, Jan. 25, 2016, 40 pages.

Kobayashi, M., et al., "Lossless Compression Method for Picture Images Using Multi Scan," vol. J87-D-II, No. 8, Augg. 2004, pp. 1603-1612.

English Translation of Kobayashi, M., et al., "Lossless Compression Method for Picture Images Using Multi Scan," vol. J87-D-II, No. 8, Aug. 2004, pp. 1603-1612.

Gai, W., et al., "A Lossless Coding Solution for HEVC," Joint Collaborative Team on Video Coding (JCT-VC), JCTVC-G664r1, Nov. 21-30, 2011, 14 pages.

Foreign Communication From a Counterpart Application, Japanese Application No. 2015-507221, Japanese Office Action dated Dec. 22, 2015, 6 pages.

Foreign Communication From A Counterpart Application, Japanese Application No. 2015-507221, English Translation of Japanese Office Action dated Dec. 22, 2015, 7 pages.

Foreign Communication From A Counterpart Application, Japanese Application No. 2015-507253, Japanese Office Action dated Dec. 22, 2015, 5 pages.

Foreign Communication From A Counterpart Application, Japanese Application No. 2015-507253, English Translation of Japanese Office Action dated Dec. 22, 2015, 6 pages.

| S(0,0) | S(0,1) | S(0,2) | S(0,3) | Pad(0) |
|---|---|---|---|---|
| S(1,0) | S(1,1) | S(1,2) | S(1,3) | Pad(1) |
| S(2,0) | S(2,1) | S(2,2) | S(2,3) | Pad(2) |
| S(3,0) | S(3,1) | S(3,2) | S(3,3) | |

*FIG. 4*

| S(0,0) | S(0,1) | ... | S(0,N-2) | S(0,N-1) |
|---|---|---|---|---|
| S(1,0) | S(1,1) | ... | S(1,N-2) | S(1,N-1) |
| ... | ... | ... | ... | ... |
| S(N-2,0) | S(N-2,1) | ... | S(N-2,N-2) | S(N-2,N-1) |
| S(N-1,0) | S(N-1,1) | ... | S(N-1,N-2) | S(N-1,N-1) |

*FIG. 5*

BINARIZATION SCHEME FOR INTRA PREDICTION RESIDUALS AND IMPROVED INTRA PREDICTION IN LOSSLESS CODING IN HEVC

CROSS-REFERENCE TO RELATED APPLICATIONS

The present application claims priority to U.S. Provisional Patent Application No. 61/636,409 filed Apr. 20, 2012 by Wen Gao, et al. and entitled "Binarization Scheme for Intra Prediction Residuals and Improved Intra Prediction in Lossless Coding in HEVC", which is incorporated herein by reference as if reproduced in its entirety, and is a continuation-in-part of U.S. patent application Ser. No. 13/866,468 filed Apr. 19, 2013 by Wen Gao, et al. and entitled "Improved Intra Prediction in Lossless Coding in HEVC", which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The amount of video data needed to depict even a relatively short film can be substantial, which may result in difficulties when the data is to be streamed or otherwise communicated across a communications network with limited bandwidth capacity. Thus, video data is generally compressed before being communicated across modern day telecommunications networks. The size of a video could also be an issue when the video is stored on a storage device because memory resources may be limited. Video compression devices often use software and/or hardware at the source to code the video data prior to transmission or storage, thereby decreasing the quantity of data needed to represent digital video images. The compressed data is then received at the destination by a video decompression device that decodes the video data. With limited network resources and ever increasing demands of higher video quality, improved compression and decompression techniques that improve compression ratio with little to no sacrifice in image quality are desirable.

For example, video compression may use intra-frame prediction, in which a pixel may be predicted from a reference pixel in the same video frame or slice. When using intra prediction in a lossy mode, transform and quantization operations may occur on a block by block basis, which may limit intra prediction for a given block to the use of reference samples in adjacent blocks for prediction of pixels within the given block. However, Joint Collaborative Team on Video Coding (JCT-VC) within the International Telecommunication Union Telecommunications Standardization Sector (ITU-T), which is responsible for a next generation video coding standard, referred to as High Efficiency Video Coding (HEVC), has considered prediction based on adjacent pixels in a block for lossless coding in intra prediction modes. These prediction techniques may be referred to as pixel-by-pixel, sample-by-sample, or pixel-based intra prediction. However, there are issues with pixel-by-pixel intra prediction for pixels along certain borders of the block being predicted due to the lack of availability of adjacent pixels to be used for the prediction of border pixels along the certain borders.

Further, the entropy encoding for lossless coding for HEVC may have been designed for lossy coding modes. However, the statistics for prediction residuals in lossless coding modes may be much different than the statistics for lossy coding modes. Due to the differing statistics there may be room to improve entropy encoding for lossless coding to take into account the statistics for prediction residuals in lossless coding modes.

SUMMARY

In one embodiment, the disclosure includes a method comprising adaptively updating a value of a Exponential-Golomb (EG) parameter according to a value of at least one encoded prediction residual value, and encoding a prediction residual value in a lossless mode using an EG code using the value of the EG parameter.

In another embodiment, the disclosure includes an apparatus comprising a processor configured to adaptively update an EG parameter according to a value of at least one encoded prediction residual value, and encode a prediction residual value in a lossless mode using an EG code using the EG parameter.

In yet another embodiment, the disclosure includes a method comprising adaptively update an EG parameter according to a value of at least one binary string in a bitstream, and decode a binary string using in a lossless mode using an EG code with the EG parameter.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 4 illustrates an embodiment of a 4×4 PU.

FIG. 5 illustrates an embodiment of a sample matrix for a PU.

DETAILED DESCRIPTION

Figure 1:
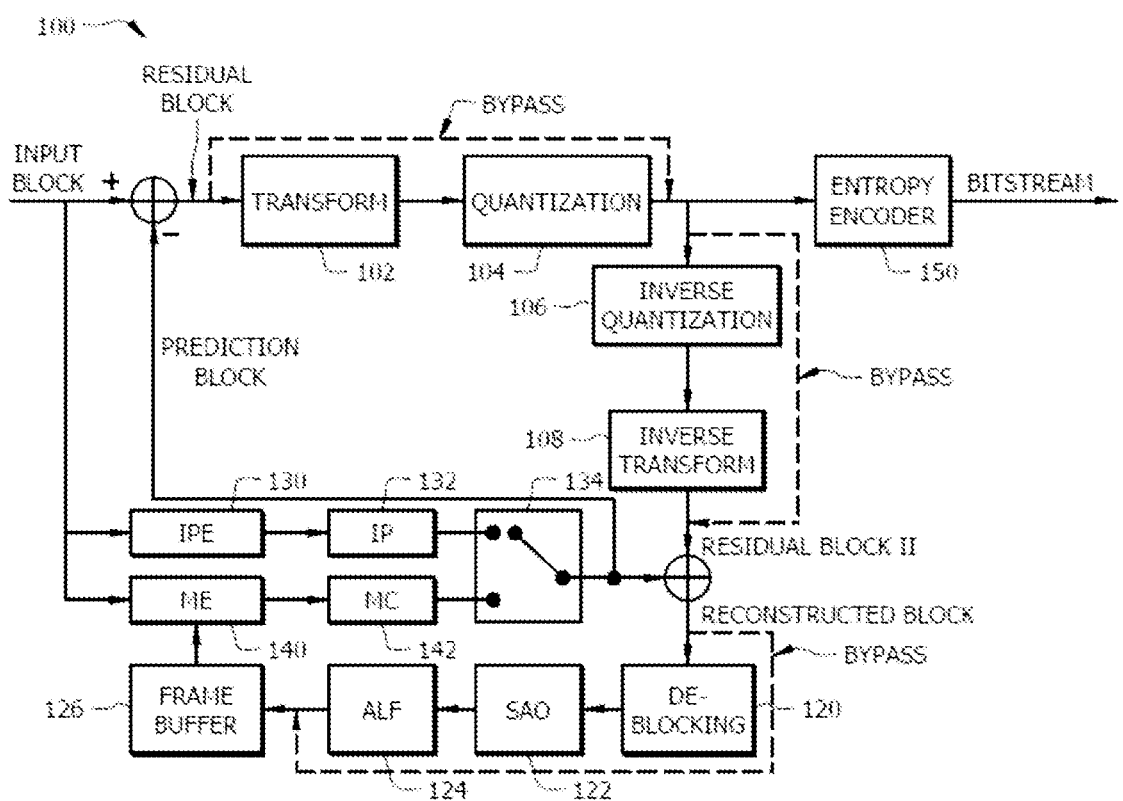
FIG. 1 is a functional diagram of an embodiment of a video encoder.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The color space may be represented by three components including a luminance (luma or Y) component and two chrominance (chroma) components, denoted as Cb and Cr (or sometimes as U and V). A luma or chroma integer value is typically stored and processed in binary form using bits. In the YUV or YCbCr color space, each luma (Y) block corresponds to two chroma blocks including a Cb block and a Cr block. The Cb block and Cr block also correspond to each other. The chroma blocks and their corresponding luma block are may be located in a same relative position of a video frame, slice, or region. The discussed approach is also applicable to video in any other color space, such as RGB, YCoCg, etc.

In video coding, various sampling rates may be used to code the YCbCr components. The size of a Cb block, its corresponding Cr block, and/or its corresponding Y block may be the same or different depending on a sampling rate. For example, in a 4:2:0 sampling rate, each N×N chroma (Cb or Cr) block may correspond to a 2N×2N luma block. In this case, a width or height of the chroma block is half that of the corresponding luma block. The chroma components are downsampled or subsampled, since human eyes may be less sensitive to chroma components than to the luma component. For another example, in a 4:4:4 sampling rate, each N×N chroma (Cb or Cr) block may correspond to a N×N luma block. In this case, higher video fidelity may be preserved, but more data may need to be coded. Other sampling rates, such as 4:2:2, 4:2:1, etc., may also be used.

In HEVC, new block concepts have been introduced. For example, a coding unit (CU) may refer to a sub-partitioning of a video frame into square blocks of equal or variable size. In HEVC, a CU may replace a macroblock structure of previous standards. Depending on a mode of inter or intra prediction, a CU may comprise one or more prediction units (PUs), each of which may serve as a basic unit of prediction. For example, for intra prediction, a 64×64 CU may be symmetrically split into four 32×32 PUs. For another example, for an inter prediction, a 64×64 CU may be asymmetrically split into a 16×64 PU and a 48×64 PU.

HEVC is still in the committee draft stage and a main profile has been defined for video sequences with 4:2:0 formats. In the HEVC main profile, a lossless coding mode may be achieved by simply bypassing transform, quantization and in-loop filters (i.e., de-blocking filter, sample adaptive offset (SAO) and adaptive loop filter (ALF)). The design is aimed to provide lossless coding without burdening the HEVC Main Profile encoder and decoder implementation. Further details on lossless as opposed to lossy coding in HEVC are provided below.

FIG. 1 is a functional diagram of an embodiment of a video encoder 100. The encoder 100 may be used in HEVC. A video frame or picture comprising an input block may be fed into the encoder 100. To encode the input block, a prediction block may be generated based on one or more reference blocks, which have been previously coded. The input block may be a luma or chroma CU or PU. The prediction block may be an estimated version of the input block. A residual block may be generated by subtracting the prediction block from the input block (or vice versa) as shown. The residual block may represent a difference between the input block and the prediction block, in other words, prediction residuals or errors. Since an amount of data needed to represent the prediction residuals may typically be less than an amount of data needed to represent the input block, the residual block may be encoded to achieve a higher compression ratio.

There are at least two possible paths in the encoder 100 depending on whether lossy or lossless coding is used. The lossy mode is addressed first. As shown in FIG. 1, in a lossy mode the residual block comprising residual pixels may be fed into a transform module 102. As a result, the residual pixels in a spatial domain may be converted to transform coefficients in a frequency domain by applying a transform matrix. The conversion may be realized through a two-dimensional transform, e.g. a transform that closely resembles or is the same as discrete cosine transform (DCT). Further, in a quantization module 104, which follows the transform module 102, a number of high-index transform coefficients may be reduced to zero, which may be skipped in subsequent entropy encoding steps. After quantization, quantized transform coefficients may be entropy encoded by an entropy encoder 150. The entropy encoder 150 may employ any entropy encoding scheme, such as context-adaptive binary arithmetic coding (CABAC) encoding, exponential Golomb encoding, or fixed length encoding, or any combination thereof. After entropy encoding, the encoded block may be transmitted by the encoder 100 as part of a bitstream. The bitstream may be packetized, encapsulated, and transmitted using any available network protocol.

In the encoder 100, the residual block may be converted to the residual block II after going through a series of operations, e.g., including transform, quantization, de-quantization, and inverse transform as shown. Since some or all of these operations may not be fully reversible, information loss may be caused during the conversion process. Thus, the residual block II may be only an approximation of the corresponding residual block, and usually comprises less non-zero residual pixels for higher compression efficiency. Further, the residual block II may be combined with the corresponding prediction block to form a reconstructed block, e.g., by adding the two blocks together. Unless otherwise stated, a corresponding block may indicate a block located at a same relative position of a picture. In this manner, the encoder 100 may implement a lossy coding mode, since the reconstructed block may be a lossy version of the input block.

The reconstructed block may be used as a reference block to generate the prediction block. Depending on the location of the reconstructed block, prediction may be categorized as inter-frame prediction and intra-frame prediction (in short as inter prediction and intra prediction respectively). In use, successive video frames or slices may be substantially correlated, such that a block in a frame does not substantially vary from a corresponding block in a previously coded frame. Inter prediction may exploit temporal redundancies in a sequence of frames or pictures, e.g. similarities between corresponding blocks of successive frames, to reduce compression data. Inter prediction may be implemented by a motion estimation (ME) module 140 followed by a motion compensation (MC) module 142. In inter prediction, a motion-compensated algorithm may be implemented to calculate a motion vector for a current block in a current frame based on a corresponding block located in one or more reference frames preceding the current frame according to an encoding order.

To improve the quality of a reconstructed video frame (e.g., by reducing blocking artifacts), an in-loop filtering step may be performed before prediction. For example, in inter prediction, a deblocking filter 120 may be applied to pixels located on the edges of the reconstructed block to remove or reduce blocking artifacts. After implementing the deblocking filter 120, sometimes the in-loop filtering step may further comprise a sample adaptive offset (SAO) module 122, which may also be configured to modify values of reconstructed pixels. An adaptive loop filter (ALF) 124 may be applied after the SAO module 122 and the resulting processed blocks may be stored in a frame buffer 126 for use in inter prediction compensation.

Similarly, within a video frame, a pixel may be correlated with other pixels within the same frame such that pixel values within a block or across some blocks may vary only slightly and/or exhibit repetitious textures. To exploit spatial correlations between neighboring blocks in the same frame, intra prediction may be implemented by an intra-prediction estimation (IPE) module 130 followed by intra prediction (IP) module 132 to interpolate the prediction block from one or more previously coded neighboring blocks (including the reconstructed block). The encoder and decoder may interpolate the prediction block independently, thereby enabling a substantial portion of a frame and/or image to be reconstructed from the communication of a relatively few number of reference blocks, e.g., blocks positioned in (and extending from) the upper-left hand corner of the frame. A selection module 134 may select between inter and intra prediction to select the best prediction mode for the input block. Generally, as understood by a person of ordinary skill in the art, the best prediction mode may be determined using rate distortion optimization (RDO) that picks the prediction mode that yields, e.g., a minimum sum of absolute differences between a predicted block and an original block.

Lossless coding is addressed next. In lossless coding modes, the transform 102, quantization 104, inverse quantization 106, and inverse transform 108 modules as well as in-loop filters (deblocking 120, SAO 122, and ALF filters 124) are bypassed as shown in FIG. 1. Transform 102 and quantization 104 modules may use block-based processing, which implies that for lossy coding modes with intra prediction the prediction of pixels within a block is based only on reference pixels in neighboring blocks. Reference pixels within the block may not be available for prediction of pixel values within the block. In contrast, for lossless coding modes with intra prediction the prediction of pixels within a block may be based on other pixels within the block since the transform and quantization modules are bypassed. For this purpose, sample based angular prediction (SAP) may be used for lossless coding.

In SAP, all the samples in a PU may share a same prediction angle as defined in B. Bross, et al. "High Efficiency Video Coding (HEVC) text specification draft 6" JCT-VC Document, JCTVC-H1003, San Jose, Calif., February 2012 (hereinafter referred to as "HEVC Draft 6"), which is hereby incorporated by reference as if reproduced in its entirety. Also, the signaling of prediction angles may be the same as that in HEVC Draft 6. A difference may be that the angular prediction is performed sample by sample for a PU in the disclosed method herein to achieve better intra prediction accuracy. That is, the prediction block for the current PU may be generated by performing the SAP sample by sample by using a same prediction angle.

Figure 2A:
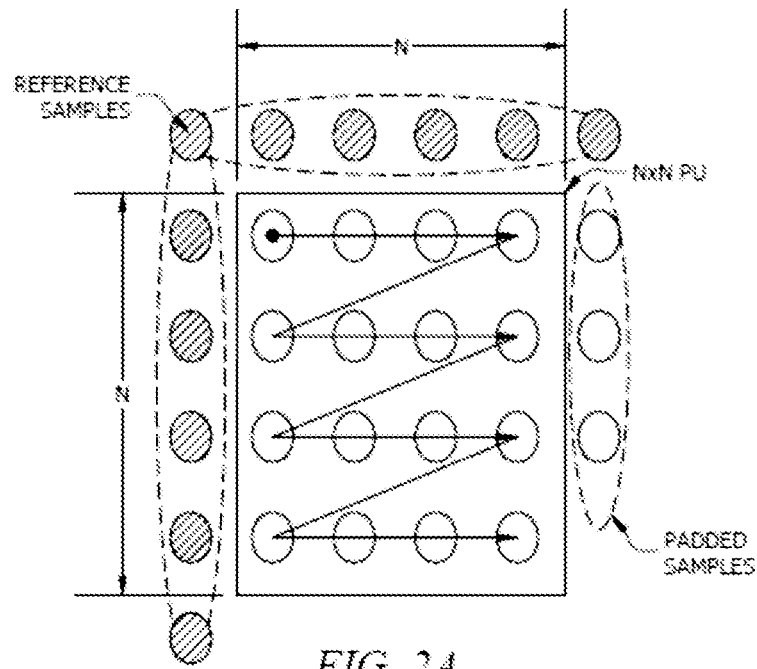
FIG. 2A illustrates a horizontal scanning processing order for vertical SAP.
Figure 2B:
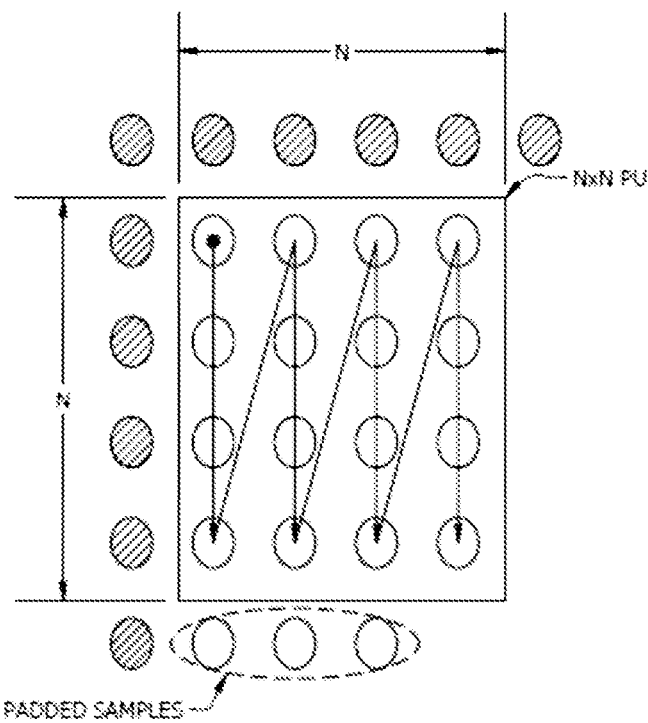
FIG. 2B illustrates a vertical scanning processing order for horizontal SAP.

In a SAP method, samples in a PU may be processed in pre-defined orders so that the neighboring samples are available when the current sample in the PU is being predicted from its direct neighbors. FIG. 2A illustrates a horizontal scanning processing order for vertical SAP, and FIG. 2B illustrates a vertical scanning processing order for horizontal SAP. As shown in FIGS. 2A and 2B, the horizontal scanning and vertical scanning processing orders may be applied to the vertical and horizontal angular predictions, respectively. The processing of reference samples around the upper and left PU boundaries of the current PU may be the same as defined in HEVC Draft 6, while reference samples around right and bottom PU boundaries of the current PU are simply padded from the closest boundary samples of the current PU (see padded samples in FIGS. 2A and 2B).

Figure 3A:
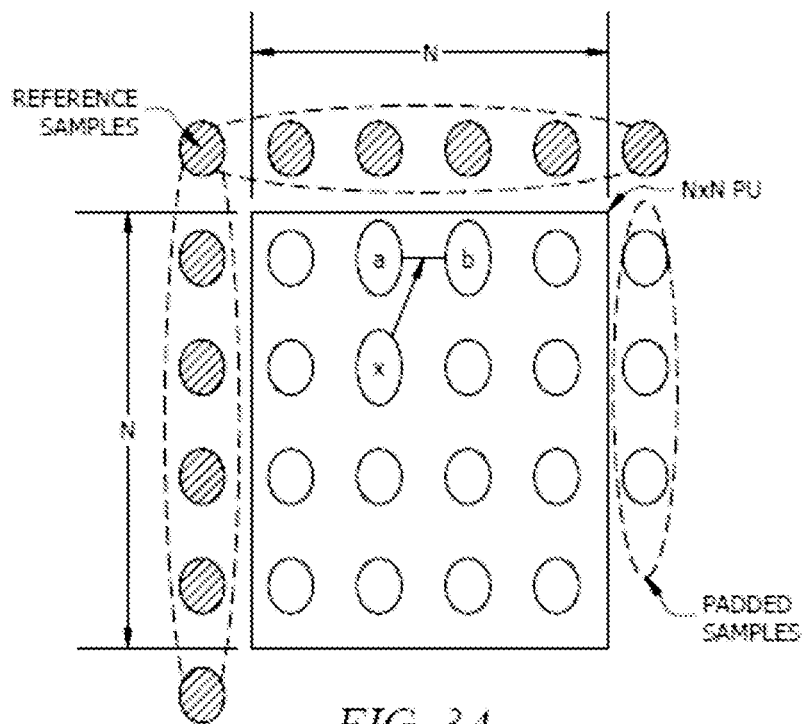
FIG. 3A illustrates vertical SAP with positive angles.
Figure 3B:
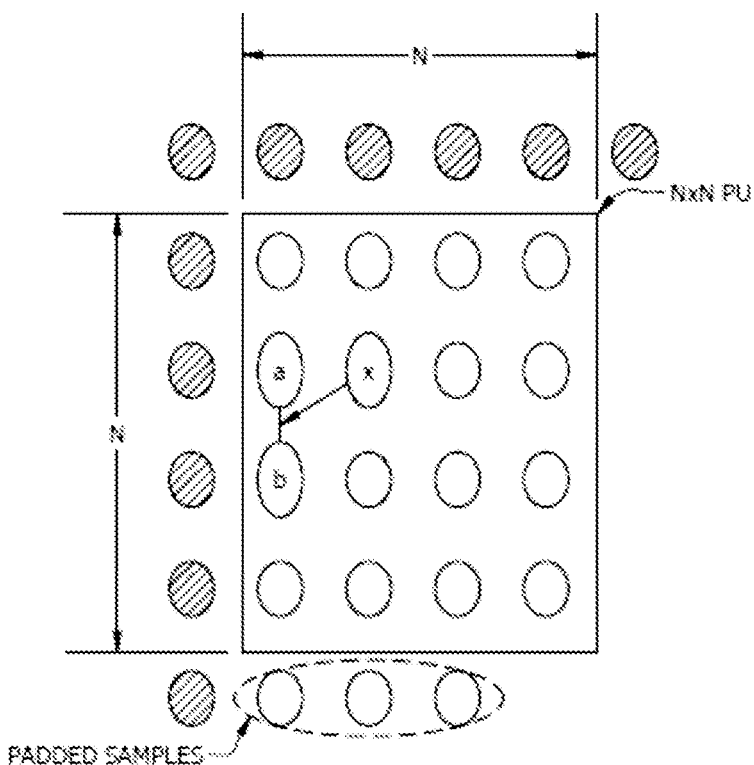
FIG. 3B illustrates horizontal SAP with positive angles.

FIG. 3A illustrates vertical SAP with positive angles, and FIG. 3B illustrates horizontal SAP with positive angles. Note that padded samples around right and bottom PU boundaries of the current PU may be required during vertical or horizontal SAP with positive angles, as shown in FIGS. 3A and 3B, respectively. In FIGS. 3A and 3B, x represents the pixel to be predicted, and a and b represent neighboring sample values (actual or predicted).

Consider vertical SAP with positive angles and a 4×4 PU as an example. FIG. 4 illustrates an embodiment of a 4×4 PU with samples (pixel values) denoted as S(i,j) for i=0,1,2,3 and j=0,1,2,3. Pad(i) for i=0,1,2 denotes padded reference samples derived using the closest samples using conventional techniques, meaning the padded reference samples may be expressed as:

$$\text{Pad}(i) = S(i,3) \text{ for } i=0, 1, 2.$$

For vertical SAP with a positive prediction angle, the prediction value for S(i,3), i=1,2,3, denoted as P(i,3), is given by the following expression, which is independent of the value of the prediction angle:

$$P(i,3) = S(i-1,3) \text{ for } i=1,2,3. \tag{1}$$

Thus, in effect the vertical prediction angle for the samples P(i,3), i=1,2,3 may be always 0 degrees, while other samples may use a different prediction angle. Stated another way, the prediction values P(i,3) for i=1,2,3 have a prediction angle of zero. The result is the same for horizontal SAP. Based on these observations, it may be desirable to predict each one of certain boundary samples using its corresponding neighboring samples or pixels, not just the pixel immediately above in vertical SAP or the pixel immediately to the left in horizontal SAP.

Disclosed herein are methods and apparatuses for improved prediction of boundary samples in PUs in pixel-based prediction. Instead of using padded samples in prediction of boundary samples that are replicas of adjacent samples and therefore express redundant information, boundary samples may be predicted using neighboring samples. The improved prediction of boundary samples may be combined with SAP of other pixels in a PU to provide an effective pixel-based prediction scheme in lossless coding modes.

Figure 6:
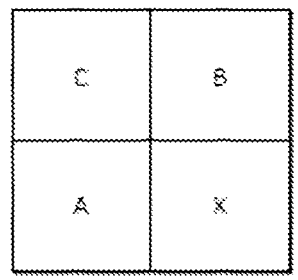
FIG. 6 illustrates a relationship between samples in a pixel-based prediction scheme.

Based on the observations above, it may be desirable to predict each one of the boundary samples, e.g., S(i,3), i=1,2,3 for vertical SAP for a 4×4 PU and S(3,i) for i=1,2,3 for horizontal SAP for a 4×4 PU, using its corresponding neighboring pixels, not just the pixel immediately above in vertical SAP or the pixel immediately to the left in horizontal SAP. FIG. 5 illustrates an embodiment of a sample matrix for a PU of size N×N. Consider vertical SAP as an example. To predict the boundary samples in bold-outlined boxes, i.e., S(i,N−1), i=1, ..., N−1, the following adaptive predictor may be used. Let X represent one of the boundary samples, i.e., X=S(i,N−1), 1≤i≤(N−1). Let P(x) denote the predicted value of the sample X. Denote X's left, upper, and upper left adjacent neighboring samples as A, B and C, respectively. FIG. 6 illustrates the relationship between samples A, B, C, and X. The sample X may be predicted as follows:

$$P(X) = \begin{cases} \min(A, B) & \text{if } C \geq \max(A, B) \\ \max(A, B) & \text{if } C \leq \min(A, B) \\ A + B - C & \text{else} \end{cases} \quad (2)$$

To illustrate the use of Equation (2) for the horizontal scanning order for vertical SAP, suppose sample S(1,N−1) needs to be predicted (i.e., X=S(1,N−1)). The neighboring samples S(1,N−2), S(0,N−1), and S(0,N−2) have been predicted using the horizontal scanning order of FIG. 2A, thus yielding P(S(1,N−2)), P(S(0,N−1)), and P(S(0,N−2)). Using the notation of Equation (2) and FIG. 6, A=P(S(1,N−2)), B=P(S(0,N−1)), and C=P(S(0,N−2)) in the determination of P(X=S(1,N−1)).

To illustrate the use of Equation (2) for the vertical scanning order for horizontal SAP, suppose sample S(N−1,1) needs to be predicted (i.e., X=S(N−1,1)). There is no available neighboring sample below S(N−1,1) for SAP prediction, so Equation (2) is used. The neighboring samples S(N−1,0), S(N−2,0), and S(N−2,1) would have been predicted using the vertical scanning order of FIG. 2B, thus yielding P(S(N−1,0)), P(S(N−2,0), and P(S(N−2,1)). Using the notation of Equation (2) and FIG. 6, A=P(S(N−1,0)), B=P(S(N−2,1)), and C=P(S(N−2,0) in the determination of P(X=S(N−1,1)) using Equation (2). In general, when horizontal SAP is used, the boundary samples using the adaptive predictor in Equation (2) may be S(N−1,i), i=1, ..., N−1. To predict one of the above boundary samples, the same predictor as described in Equation (2) may be used.

Equation (2) is but one possible way to predict a sample value based on neighboring sample values for certain boundary samples S(i,N−1) or S(N−1,i) for i=1, ..., N−1. Other possibilities include computing a median or an average of values A, B, and C.

Figure 7A:
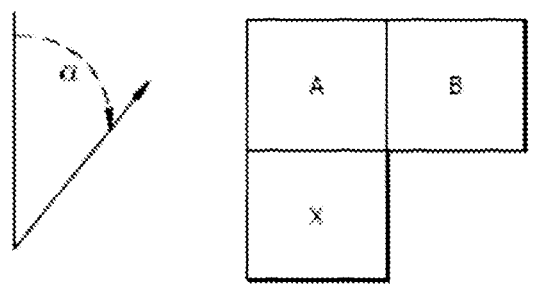
FIG. 7A illustrates vertical SAP using a positive angle, denoted as $\alpha$.
Figure 7B:
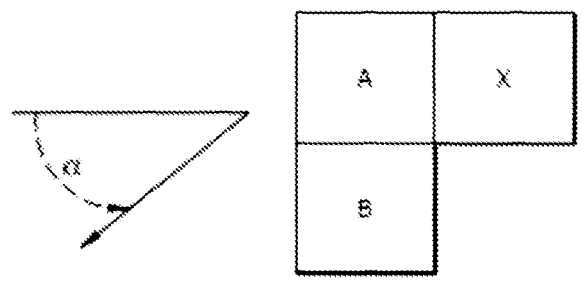
FIG. 7B illustrates horizontal SAP using a positive angle.

If a sample is not one of the boundary samples S(i,N−1) (for vertical SAP) or S(N−1,i) (for horizontal SAP) for i=1, 2, ..., N−1, then any conventional SAP technique may be used. FIG. 7A illustrates vertical SAP using a positive angle, denoted as α, and FIG. 7B illustrates horizontal SAP using a positive angle, also denoted as a. In FIGS. 7A and 7B, X denotes the pixel value to be predicted and A and B represent actual or predicted pixel values for neighboring pixels. In both cases, X may be a weighted (or linear) combination of A and B. For example, X may be expressed as $$X=(1−s)*A+s*B, \quad (3)$$

where s is a weighting factor in the range [0,1]. The weighting factor should give more weight to A when α is small, and the weight given to B should increase as a increases. The weighting factor s may be, for example, equal to tan(α), where 0≤α≤45 degrees. The Intra prediction method specified in HEVC is one of these possible ways to calculate these weighting factors.

Figure 8:
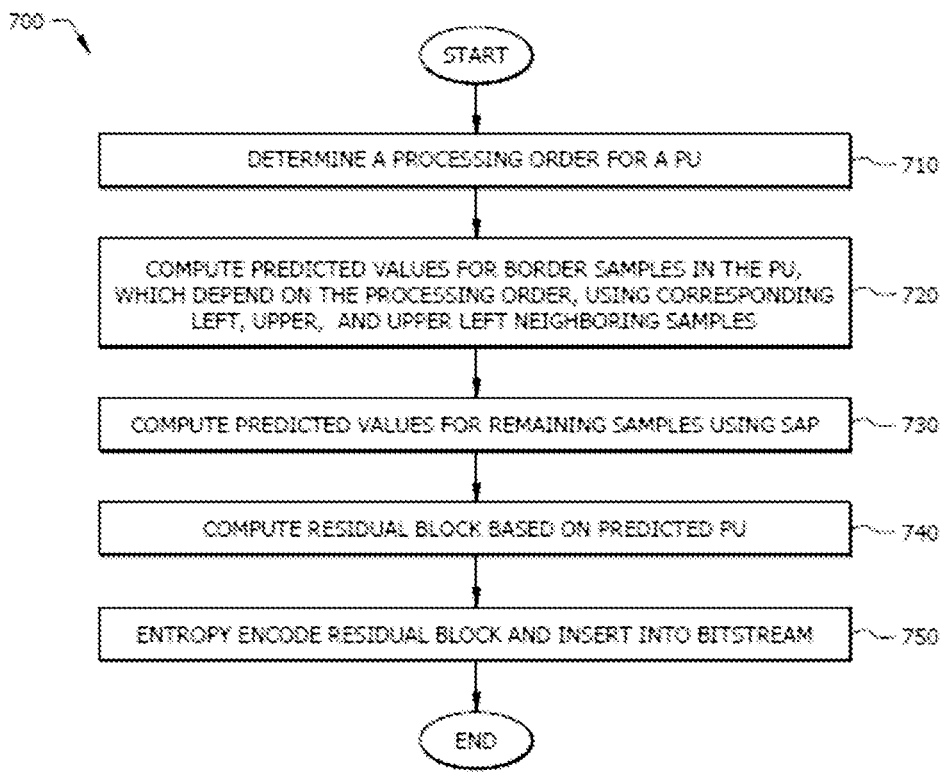
FIG. 8 is a flowchart of an embodiment of a method for encoding a PU in a lossless mode.

FIG. 8 is a flowchart of an embodiment of a method 700 for encoding a PU in a lossless mode. The method begins in block 710. In block 710, a processing order for the PU is determined. The processing order may be a horizontal processing order, e.g., as shown in FIG. 2A, or a vertical processing order, e.g., as shown in FIG. 2B. Next in block 720 the predicted values for border samples in the PU are computed. The border samples to be predicted may be denoted as S(i, N−1) for i=1,2, ..., N−1 for a horizontal processing order (i.e., when vertical SAP is used for other samples) and S(N−1,i) for i=1,2, ..., N−1 for a vertical processing order (i.e., when horizontal SAP is used for other samples). That is, the particular border samples to be predicted depend on the scanning or processing order. The PU may be arranged as shown in FIG. 5. The predicted values for the border samples may be computed based on the corresponding left, upper, and upper left neighboring samples, e.g. as illustrated in FIG. 6 and using Equation (2). Next in block 730 the predicted values for the remaining samples in the PU (i.e., all samples in the PU other than the aforementioned border samples) are computed using SAP. Any conventional SAP technique may be used, which predicts a sample as a linear combination of two neighboring samples, with the combination depending on a prediction angle. Equation (3) illustrates one example of a SAP technique. The blocks 720 and 730 may be performed in either order or in parallel. In block 740, after the predicted values for all the samples in a PU are determined to provide a prediction PU or prediction block, a residual block may be computed as shown in FIG. 1, which may be a difference between an input block and the computed prediction block. Finally, in block 750 the residual block may be encoded using entropy encoding, e.g., as shown in FIG. 1. Recall that the transform 102 and quantization 104 modules are bypassed in lossless mode, so that the residual block may be provided directly to the entropy encoder 150. The entropy encoded values may be inserted into a bitstream. The PU may comprise luma or chroma samples. The method 700 may be applied to luma samples only, chroma samples only, or both luma samples and chroma samples.

Figure 9:
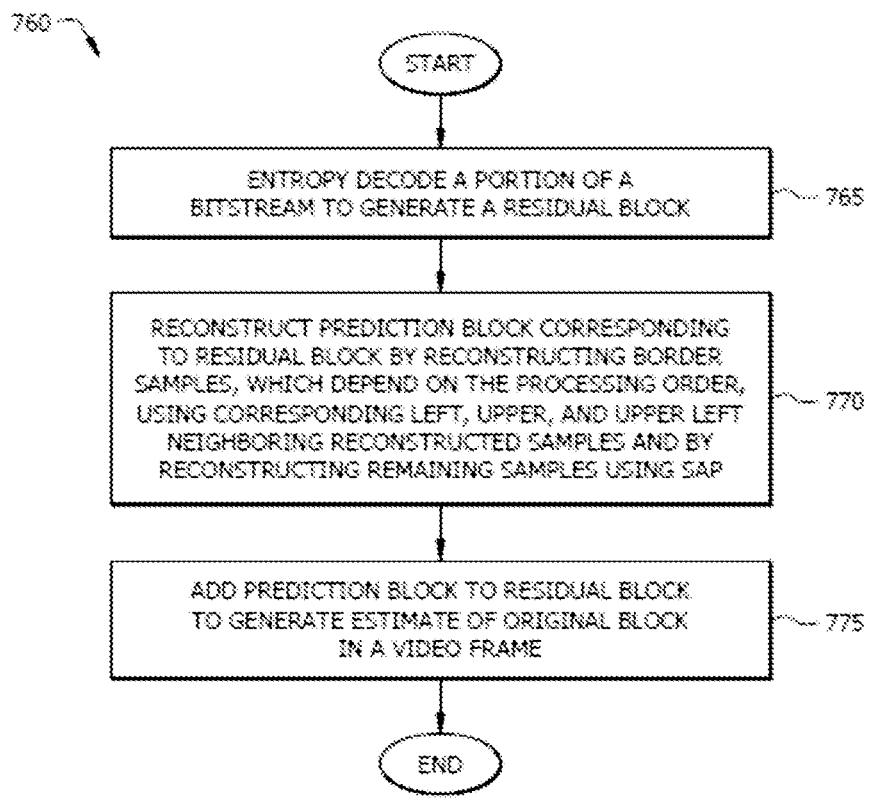
FIG. 9 is a flowchart of an embodiment of a decoding method in a lossless decoding mode.

FIG. 9 is a flowchart of an embodiment of a decoding method 760 in a lossless decoding mode. Given the details of the video encoding schemes described herein a person of ordinary skill in the art could formulate a decoding to reverse or "undo" the encoding described herein. However, the method 760 is provided for illustration and convenience. The method 760 starts in block 765 in which a portion of a bitstream is decoded using entropy decoding to generate a residual block. In block 770 a prediction block is reconstructed based on a plurality of reference pixels external to the residual block in one or more previously decoded neighboring blocks. Border samples identified based on the processing order may be reconstructed using corresponding left, upper, and upper left neighboring reconstructed samples. The remaining samples in the prediction block may be reconstructed using SAP (vertical SAP for a horizontal processing order and horizontal SAP for a vertical processing order). In block 775 the prediction block may be added to the residual block to obtain an estimate of an original block (e.g., an input PU) in a video frame. The original block may be luma or chroma samples.

In HEVC Draft 6, when a coding unit employs lossless coding mode, the binarization scheme for intra Luma prediction residuals is the same as that for intra Luma transform coefficient levels. Due to the different statistics between the two sets of data, the binarization scheme can be further improved for Luma prediction residuals without significant changes to the existing scheme.

Figure 10:
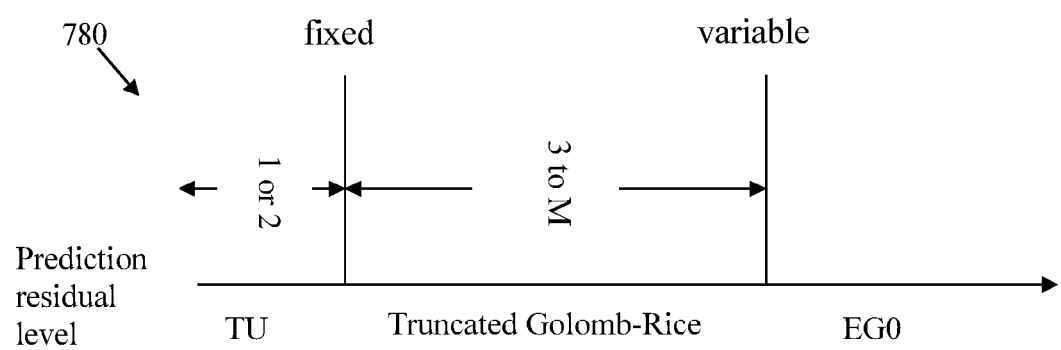
FIG. 10 illustrates an embodiment of a binarization scheme implemented in a video codec.

The encoding process of the transform coefficient levels may comprise two major parts: binarization that converts levels into a sequence of bins, and binary arithmetic entropy coding that compresses bins into bits (collectively implemented as entropy encoding, e.g., using an entropy encoder). FIG. 10 illustrates an embodiment of a binarization scheme 780 implemented in a video codec. Depending on the absolute value of a prediction residual (denoted as X), its binary representation may include one, two, or three parts. A residual block, e.g., as illustrated in FIG. 1, may comprise a plurality of prediction residuals. As discussed previously, a prediction residual may be a difference between an original pixel and a prediction pixel. In an embodiment, if X equals 1 or 2, X may be binarized as one part using a unary code in which 1 is binarized as "0" and 2 is binarized as "10". Such an encoding may be referred to as a truncated unary code (TU) with maximum length of 2. If X≥3, the value 3 is first binarized using a binary string "11" and the value (X−3) is further binarized using a truncated Golomb-Rice (TR) code. For a TR code, the maximum value that can be represented is denoted as M. If (X−3)≤M, (M−3) may be represented by a TR. However, if (X−3)≥(M+1), the value (M+1) is first binarized with an all-one binary string. The rest of the (X−3−(M+1)) is then encoded using an Exponential-Golomb (EG) code with parameter K=0, referred to as an EG0 code. The EG code is one example of a universal code, which maps positive integers to binary codewords as understood by a person of ordinary skill in the art. Other universal codes may be used instead of the EG code.

Note that the above binarization method was originally designed for coding quantized transform coefficients, which typically have small values. However, the input to the binarization operation for luma component in the lossless coding case may be intra prediction residuals without transform and quantization, which exhibit different statistic characteristics from that of intra coded transform coefficients.

Figure 11:
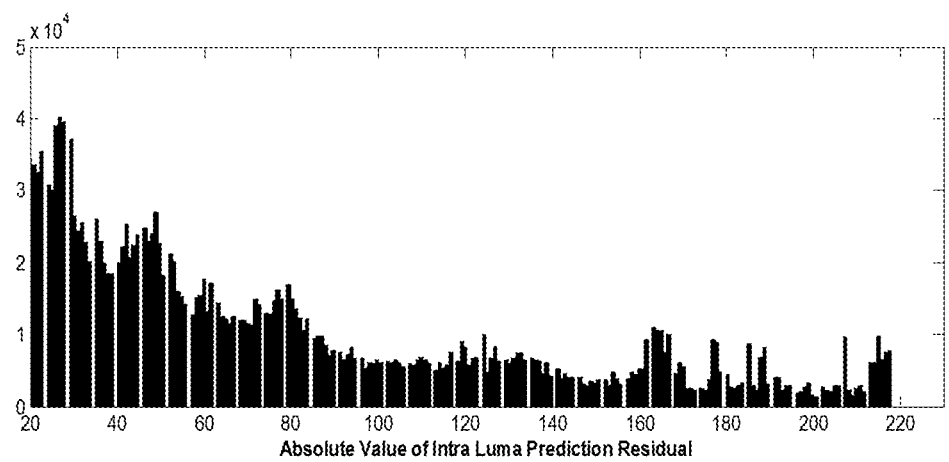
FIG. 11 is a histogram of intra prediction residuals in lossless coding.
Figure 12:
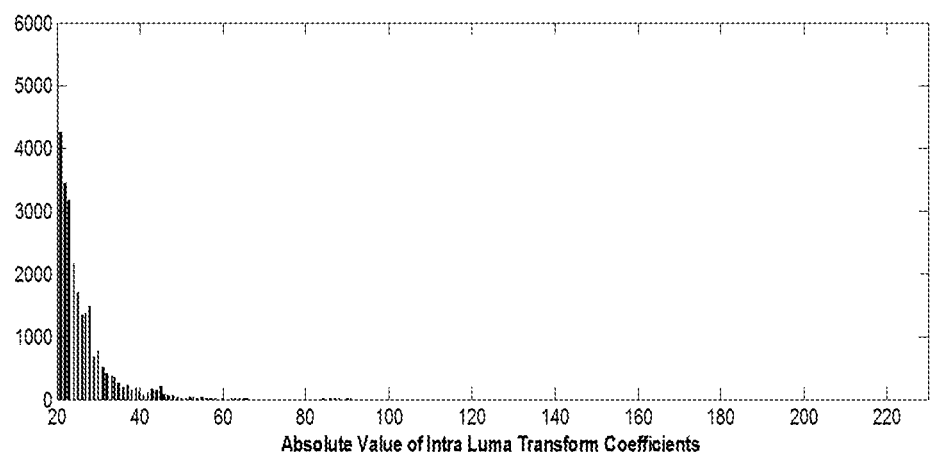
FIG. 12 is a histogram of quantized and transformed intra prediction residuals.

Using a SlideEditing test sequence as an example, the histogram of its intra Luma prediction residuals in lossless coding and the histogram of its quantized transform coefficients when coded using QP=27 are shown in FIGS. 11 and 12, respectively. As illustrated by these results, large Luma prediction residuals appear with relatively higher frequency in the lossless case compared to transform coefficients.

If a prediction residual value is large, the value left for the binarization with EG0 code may be also relatively large, resulting in inefficient representation. It may be more efficient to represent a large value using an EG code of higher order, compared to an EG code with a small K parameter. However, the K parameter cannot be too large since it can introduce coding penalty for small values.

Disclosed herein are methods and apparatuses for performing adaptive binarization that take into account statistics of prediction residuals. Adaptive binarization may be better suited for the statistics of prediction residuals of lossless coding schemes than conventional binarization schemes. Adaptive binarization as disclosed herein includes adapting the value of K of the EG code according to average levels of past binarized intra prediction residuals.

Figure 13:
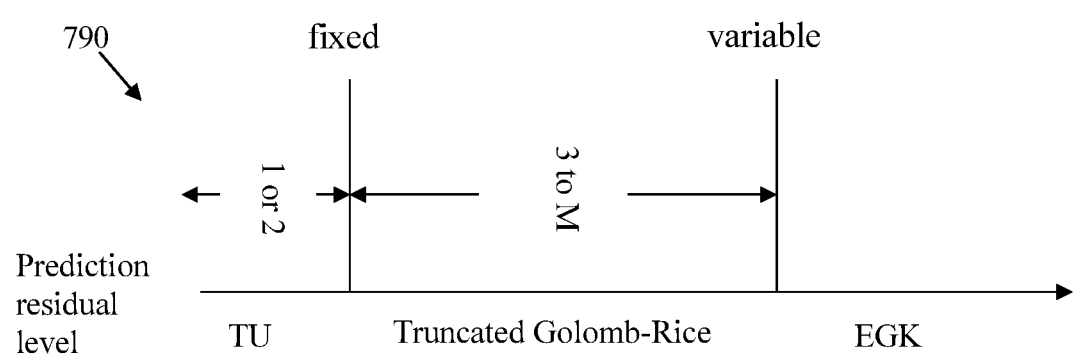
FIG. 13 illustrates an embodiment of a binarization scheme implemented in a video codec.

FIG. 13 illustrates an embodiment of a binarization scheme 790 implemented in a video codec. As discussed for the scheme 780 in FIG. 12, if (X−3)≥(M+1), the value (M+1) is first binarized with an all-one binary string. The rest of the (X−3−(M+1)) is then encoded using an EG code with k=0 (i.e., the EG0 code). In contrast, the scheme 790 in FIG. 13 may adapt the parameter K (sometimes referred to herein as the EG parameter) of an EG code if (X−3)≥(M+1) as described hereafter. EG coding with parameter K is sometimes referred to as EGK. If the condition (X−3)≥(M+1) is not satisfied, the encoding is the same as for FIG. 12.

Figure 14:
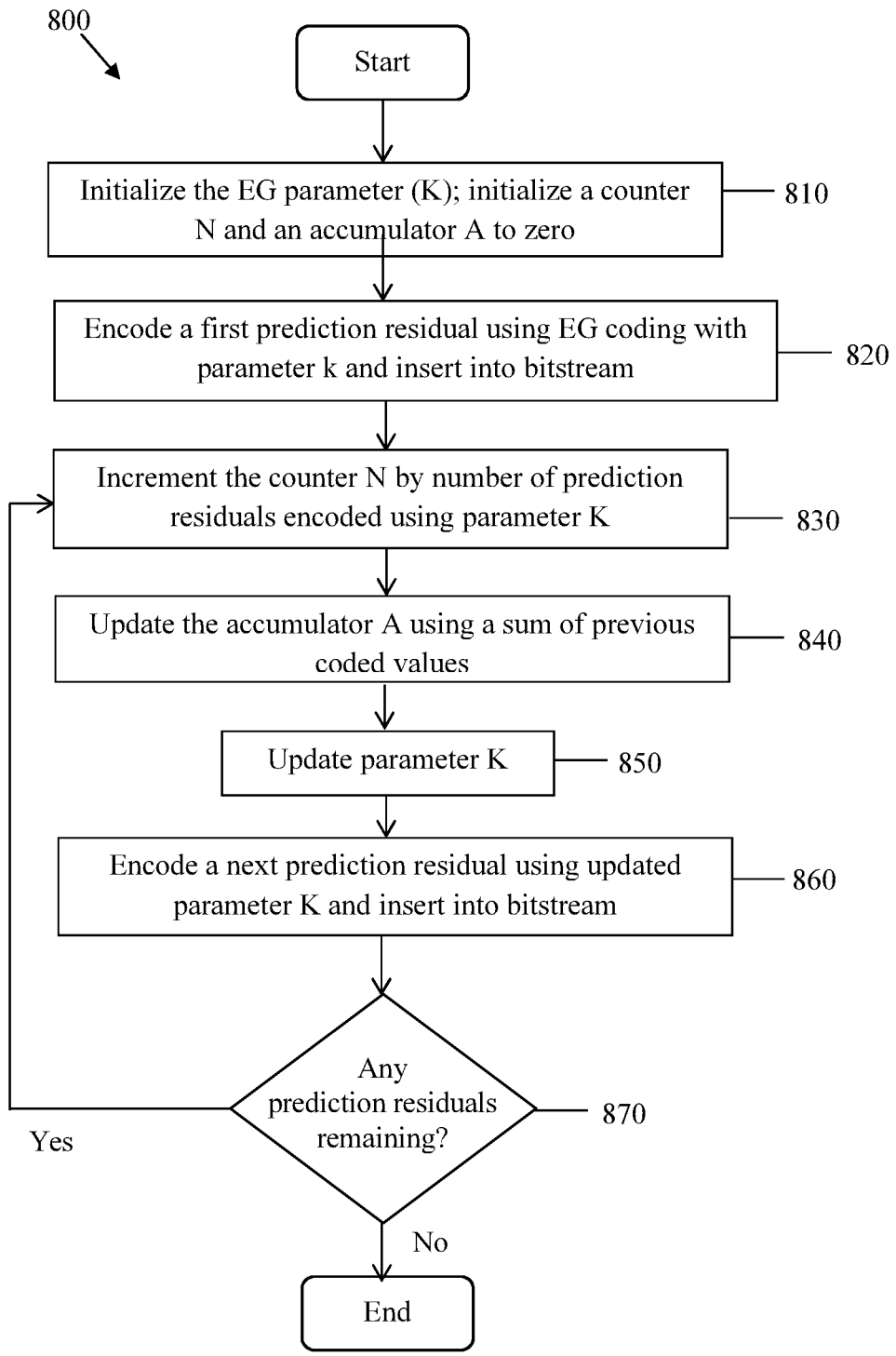
FIG. 14 is a flowchart of an embodiment of a method for binarization in a lossless encoding mode.

FIG. 14 is a flowchart of an embodiment of a method 800 for binarization in a lossless encoding mode. The method 800 begins in block 810, wherein the EG parameter is initialized to a predetermined value, e.g., 0 or 3. Also in block 810 a counter, denoted as N, and an accumulator, denoted as A, (variables used in later parts of method 800) may be set to zero. Next in block 820 a first prediction residual is encoded using EG coding with the selected EG parameter. For example, if the EG parameter is k=3, EG3 coding is used. The method 800 applies for prediction residuals that satisfy (X−3)≥(M+1), and for these prediction residuals the value (M+1) is binarized with an all-one binary string. The rest of the value (X−3−(M+1)) may be encoded using an EG code. In block 830 the counter N is updated as the number of prediction residuals coded using EG code with parameter K, including the current one in a coefficient group (typically a block of 16 prediction residuals), where $0 \leq K \leq K_{max}$ and $K_{max}$ is the maximum allowed value. Next in block 840 the accumulator A is updated using the most recent coded values that use parameter K. The accumulator A may be updated as the summation of the coded values from previous encodings in the form of (X−3−(M+1)) if (X−3)≥(M+1), including the current one within a coefficient group. In block 850 the value of parameter K is updated. A number of embodiments may be used to update the parameter K, including one of the following six alternative embodiments.

A first embodiment for updating the parameter K is as follows:

for (int $i=0;((N<<i)<A)\&\&(i<K_{max});i++$)

$K=i$       (Eq. 1)

where the syntax is understood by a person of ordinary skill in the art. That is, (N<<i) denotes shifting a binary representation of the integer N to the left by i bits, i++ denotes incrementing i by one, and "&&" denotes the logical AND operator. Note that the operation to update the K parameter may be minor since it only involves one addition, at most (Kmax+1) increment operations, at most $K_{max}$ left shift operations, and at most $2K_{max}$ comparison operations.

A second embodiment for updating the parameter K is as follows:

for (int $i=0;(N<<i)<A;i++$)

$K=\max(i,K_{max})$       (Eq. 2)

A third embodiment for updating the parameter K is as follows:

for (int $i=0;((N<<i)<(w*A))\&\&(i<K_{max});i++$)

$K=i$       (Eq. 3)

where w is a predefined parameter to adjust the adaptation speed. The method in (Eq. 1) may correspond to the method in (Eq. 3) using w=1. If w>1, the adaptation speed may be faster than the method using w=1. If w<1, the adaptation speed may be slower than the method using w=1.

A fourth embodiment for updating the parameter K is as follows:

for (int $i=0;(N<<i)<(w*A);i++$)

$K=\max(i,K\max)$       (Eq. 4)

If we want to fine tune the adaptation rate, a positive coefficient array c[i], i=0, ..., $K_{max}$ may be introduced. A fifth embodiment for updating the parameter K is as follows:

$$\text{for (int } i=0; ((c[i]*(N<<i))<A)\&\&(i<K_{max}); i++)$$

$$K=i \qquad \text{(Eq. 5)}$$

Note that c[i]=1 for i=0, ..., $K_{max}$ may correspond to the method in (Eq. 1).

A sixth embodiment for updating the parameter K is as follows:

$$\text{for (int } i=0; (c[i]*(N<<i))<A; i++)$$

$$K=\max(i, K\max) \qquad \text{(Eq. 6)}$$

The embodiments disclosed in (Eq. 1) to (Eq. 6) may apply only to Luma components. Alternatively, the embodiments disclosed in (Eq. 1) to (Eq. 6) may apply to both Luma and Chroma components. In block 860 a next prediction residual value is encoded using the updated parameter K and the result is inserted into the bitstream. In decision block 870 a decision is made whether there are any prediction residuals remaining to be encoded. If so, the flowchart 800 returns to block 830 and blocks 830-860 are repeated for the next prediction residual. If not, the method 800 ends. Although the method 800 is described in terms of updating the parameter K on a sample-by-sample or value-by-value basis, the parameter K may instead be updated on a block-by-block basis. For any prediction residuals that do not satisfy (X−3)≥(M+1), the prediction residuals are encoded using the TU and TR codes as described with respect to FIGS. 12 and 13. The adaptation of the parameter K may be performed within a coefficient group, e.g., a 4×4 residual block, in which case N and A are initialized at the beginning of the residual block and the steps 830-860 may be repeated for the pixels in a residual block. The parameter K may be reinitialized at the beginning of each residual block, or alternatively the parameter K may initialized once at the beginning of a frame and the parameter K may be carried over from residual block to residual block (e.g., the parameter K at the beginning of a residual block is the same as the parameter K at the end of the previous residual block).

Figure 15:
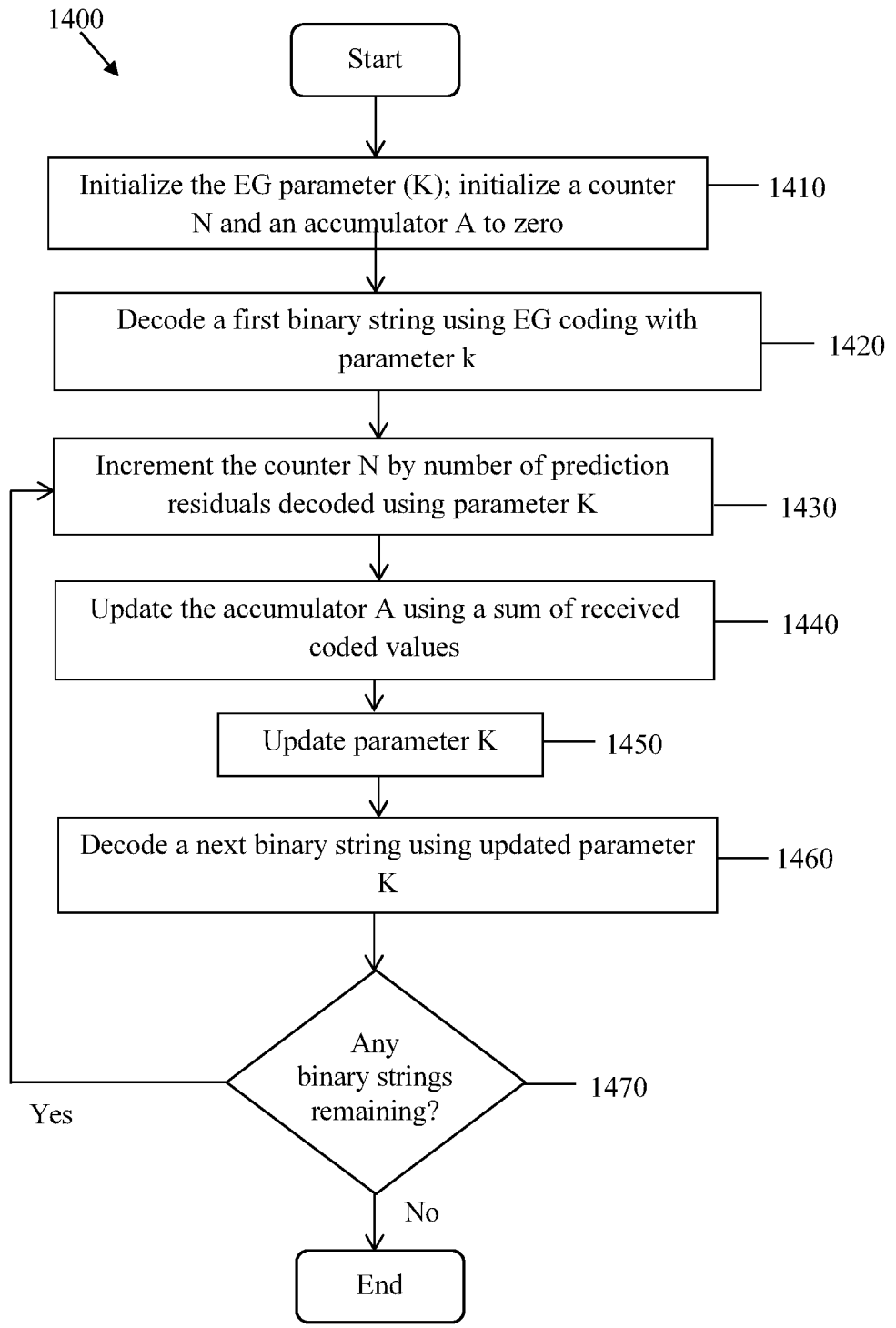
FIG. 15 is a flowchart of an embodiment of a method for decoding a bitstream.

As understood by a person of ordinary skill in the art, an entropy decoding may use similar operations to those specified in the method 800 to decode a received bitstream. FIG. 15 is a flowchart of an embodiment of a method 1400 for decoding a bitstream generated by the method 800 in FIG. 14. The steps of method 1400 are similar to the steps of method 800, except that blocks 1420 and 1460 involve decoding of received binary strings in a received bitstream to produce prediction residuals instead of encoding prediction residuals to produce binary strings.

Figure 16:
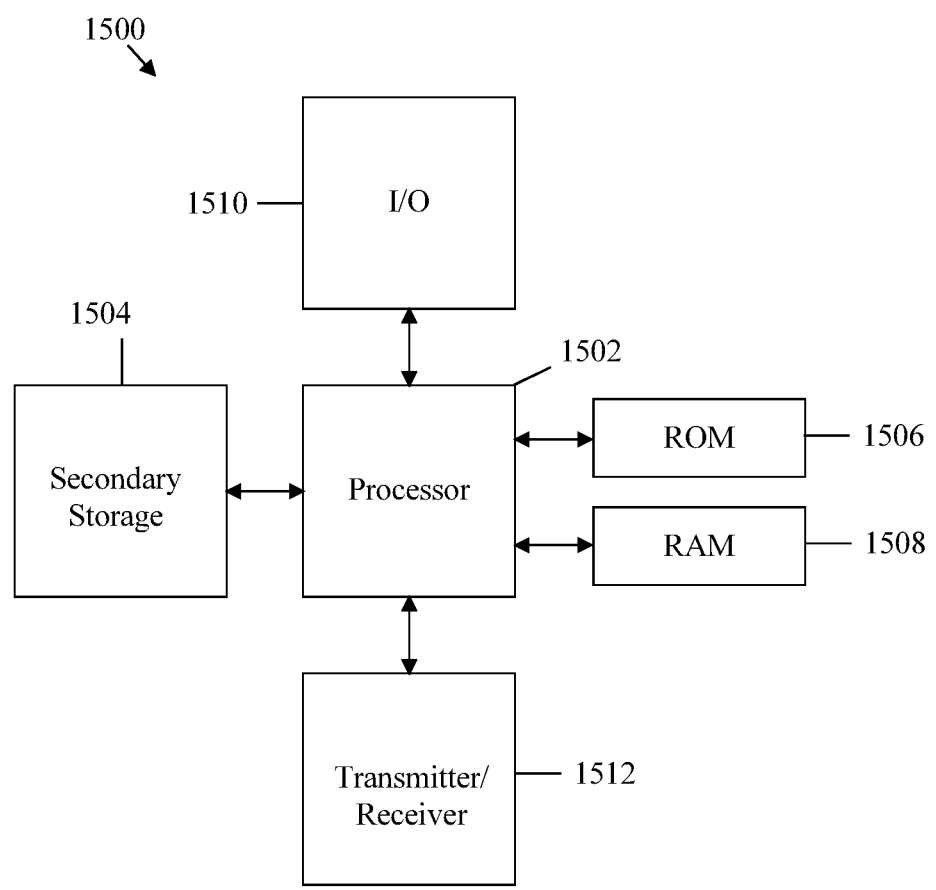
FIG. 16 is a schematic diagram of an embodiment of a network node.

The schemes described above may be implemented on a network component, such as a computer or network component with sufficient processing power, memory resources, and network throughput capability to handle the necessary workload placed upon it. FIG. 16 is a schematic diagram of an embodiment of a network component or node 1500 suitable for implementing one or more embodiments of the video codecs or methods disclosed herein, such as the encoder 100, the method 700 for encoding a PU, the method 760 for decoding a PU, the method 800 for binarization in a lossless coding mode, and the method 1400 for decoding. The network node 1500 includes a processor 1502 that is in communication with memory devices including secondary storage 1504, read only memory (ROM) 1506, random access memory (RAM) 1508, input/output (I/O) devices 1510, and transmitter/receiver (or transceiver) 1512. The I/O devices 1510 and/or the transmitter/receiver 1512 may be optional and if not included the network node 1500 becomes a computing device in which case an encoded bitstream or a decoded video stream may be stored in memory. The processor 1502 may be implemented as one or more central processing unit (CPU) chips, cores (e.g., a multi-core processor), field-programmable gate arrays (FPGAs), application specific integrated circuits (ASICs), and/or digital signal processors (DSPs). The processor 1502 may be implemented using hardware or a combination of hardware and software.

The secondary storage 1504 typically comprises one or more disk drives or tape drives and is used for non-volatile storage of data and as an over-flow data storage device if RAM 1508 is not large enough to hold all working data. Secondary storage 1504 may be used to store programs that are loaded into RAM 1508 when such programs are selected for execution. The ROM 1506 is used to store instructions and perhaps data that are read during program execution. ROM 1506 is a non-volatile memory device that typically has a small memory capacity relative to the larger memory capacity of secondary storage 1504. The RAM 1508 is used to store volatile data and perhaps to store instructions. Access to both ROM 1506 and RAM 1508 is typically faster than to secondary storage 804.

The transmitter/receiver 1512 may serve as an output and/or input device of the network node 1500. For example, if the transmitter/receiver 1512 is acting as a transmitter, it may transmit data out of the network node 1500. If the transmitter/receiver 1512 is acting as a receiver, it may receive data into the network node 1500. The transmitter/receiver 1512 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. The transmitter/receiver 812 may provide an avenue for the processor 1502 to communicate with an Internet or one or more intranets. If the network node 1500 is acting as a video encoder, the processor 1502 may encode a bitstream. The processor 1502 may also packetize and encapsulate (i.e., format) the bitstream for transmission and provide the formatted bitstream to the transmitter/receiver 1512. The transmitter/receiver 1512 would then transmit the formatted bitstream. Likewise, if the network node 1500 is acting as a video decoder, the transmitter/receiver may receive a formatted bitstream.

I/O devices 1510 may include a video monitor, liquid crystal display (LCD), touch screen display, or other type of video display for displaying video, and/or may include a video recording device for capturing video. I/O devices 1510 may also include one or more keyboards, mice, or track balls, or other well-known input devices. If the network node 1500 is acting as a video encoder, a video stream to be encoded may be provided by I/O devices 1510 or may be provided in another manner. Similarly, if the network node 1500 is acting as a video decoder, a video stream to be decoded may be received via the transmitter/receiver 1512 or may be provided in another manner.

It is understood that by programming and/or loading executable instructions onto the network node 1500, at least one of the processor 1502, the secondary storage 1504, the RAM 1508, and the ROM 1506 are changed, transforming the network node 1500 in part into a particular machine or apparatus (e.g., a video codec having the functionality taught by the present disclosure). The executable instructions may be stored on the secondary storage 1504, the ROM 1506, and/or the RAM 1508 and loaded into the processor 1502 for execution. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means +/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method comprising:
adaptively updating, using an encoder, a value of an Exponential-Golomb (EG) parameter according to a value of at least one encoded prediction residual value when a prediction residual value difference (X−3) is greater than or equal to a maximum value of a truncated unary code (TU) plus one (M+1); and
encoding, using the encoder, a prediction residual value in a lossless mode using an EG code using the value of the EG parameter.

2. The method of claim 1, wherein the EG parameter is adaptively updated by:
incrementing a counter by a number of at least one prediction residual that was coded using the value of the EG parameter; and
updating an accumulator using a sum of previous coded values of the at least one prediction residual.

3. The method of claim 2, further comprising:
initializing the value of the EG parameter to an initial value; and
encoding a first prediction residual value using EG coding using the initial value,
wherein updating the counter and updating the accumulator account for the encoded first prediction residual value.

4. The method of claim 3, further comprising:
initializing the counter to zero prior to encoding a residual block, wherein the residual block comprises a plurality of prediction residual values that includes the prediction residual value;
initializing the accumulator to zero prior to encoding the residual block,
wherein a final EG parameter for the residual block is carried over to be an initial EG parameter for the next residual block immediately after the residual block.

5. The method of claim 3, further comprising:
initializing the counter to zero prior to encoding a residual block, wherein the residual block comprises a plurality of prediction residual values that includes the prediction residual value;
initializing the accumulator to zero prior to encoding the residual block,
wherein an initial EG parameter for the next residual block after the residual block is initialized to a value independent of a final EG parameter for the residual block.

6. The method of claim 3, wherein the value of the EG parameter is determined as $$\text{for (int } i=0; ((N<<i)<A) \&\& (i<K_{max}); i++)$$

$$K=i,$$

where K denotes the value of the EG parameter, N denotes the counter, and A denotes the accumulator.

7. The method of claim 3, wherein the value of the EG parameter is determined as $$\text{for (int } i=0; (N<<i)<A; i++)$$

$$K=\max(i, K_{max}),$$

where K denotes the value of the EG parameter, N denotes the counter, A denotes the accumulator, and $K_{max}$ is a maximum allowed value of K.

8. The method of claim 3, wherein the value of the EG parameter is determined as $$\text{for (int } i=0; ((N<<i)<(w*A)) \&\& (i<K_{max}); i++)$$

$$K=i$$

where w is a predefined parameter to adjust the adaptation speed, K denotes the value of the EG parameter, N denotes the counter, A denotes the accumulator, and $K_{max}$ is a maximum allowed value of K.

9. The method of claim 3, wherein the value of the EG parameter is determined as $$\text{for (int } i=0; (N<<i)<(w*A); i++)$$

$$K=\max(i, K\max),$$

where w is a predefined parameter to adjust the adaptation speed, K denotes the value of the EG parameter, N denotes the counter, A denotes the accumulator, and $K_{max}$ is a maximum allowed value of K.

10. The method of claim 3, wherein the value of the EG parameter is determined as $$\text{for (int } i=0; ((c[i]*(N<<i))<A) \&\& (i<K_{max}); i++)$$

$$K=I,$$

where c[i] is a positive coefficient array for $i=0, \ldots, K_{max}$, K denotes the value of the EG parameter, N denotes the counter, A denotes the accumulator, and $K_{max}$ is a maximum allowed value of K.

11. The method of claim 3, wherein the value of the EG parameter is determined as $$\text{for (int } i=0; (c[i]*(N<<i))<A; i++)$$

$$K=\max(i, K\max),$$

where c[i] is a positive coefficient array for $i=0, \ldots, K_{max}$, K denotes the value of the EG parameter, N denotes the counter, A denotes the accumulator, and $K_{max}$ is the maximum allowed value of K.

12. An apparatus comprising:
a processor configured to:
adaptively update an Exponential-Golomb (EG) parameter according to a value of at least one encoded prediction residual value when a prediction residual value difference (X−3) is greater than or equal to a maximum value of a truncated unary code (TU) plus one (M+1); and
encode a prediction residual value in a lossless mode using an EG code with the EG parameter.

13. The apparatus of claim 12, wherein the EG parameter is adaptively updated by:
incrementing a counter by a number of at least one prediction residual that was coded using the value of the EG parameter; and
updating an accumulator using a sum of previous coded values of the at least one prediction residual.

14. The apparatus of claim 13, wherein the processor is further configured to:
initialize the value of the EG parameter to an initial value; and
encode a first prediction residual using EG coding using the initial value,
wherein updating the counter and updating the accumulator account for the encoded first prediction residual.

15. The apparatus of claim 14, wherein the value of the EG parameter is determined as $$\text{for (int } i=0; ((N<<i)<A) \&\& (i<K_{max}); i++)$$

$$K=i,$$

where K denotes the value of the EG parameter, N denotes the counter, and A denotes the accumulator.

16. The apparatus of claim 14, wherein the value of the EG parameter is determined as $$\text{for (int } i=0; (N<<i)<A; i++)$$

$$K=\max(i, K_{max}),$$

where K denotes the value of the EG parameter, N denotes the counter, A denotes the accumulator, and $K_{max}$ is a maximum allowed value of K.

17. The apparatus of claim 14, wherein the value of the EG parameter is determined as $$\text{for (int } i=0; ((N<<i)<(w*A)) \&\& (i<K_{max}); i++)$$

$$K=i$$

where w is a predefined parameter to adjust the adaptation speed, K denotes the value of the EG parameter, N denotes the counter, A denotes the accumulator, and $K_{max}$ is a maximum allowed value of K.

18. The apparatus of claim 14, wherein the value of the EG parameter is determined as $$\text{for (int } i=0; (N<<i)<(w*A); i++)$$

$$K=\max(i, K\max),$$

where w is a predefined parameter to adjust the adaptation speed, K denotes the value of the EG parameter, N denotes the counter, A denotes the accumulator, and $K_{max}$ is a maximum allowed value of K.

19. The apparatus of claim 14, wherein the value of the EG parameter is determined as $$\text{for (int } i=0; ((c[i]*(N<<i))<A) \&\& (i<K_{max}); i++)$$

$$K=I,$$

where c[i] is a positive coefficient array for i=0, ..., $K_{max}$, K denotes the value of the EG parameter, N denotes the counter, A denotes the accumulator, and $K_{max}$ is a maximum allowed value of K.

20. The apparatus of claim 14, wherein the value of the EG parameter is determined as $$\text{for (int } i=0; (c[i]*(N<<i))<A; i++)$$

$$K = \max(i, K\max),$$

where c[i] is a positive coefficient array for i=0, ..., $K_{max}$, K denotes the value of the EG parameter, N denotes the counter, A denotes the accumulator, and $K_{max}$ is a maximum allowed value of K.

21. A method comprising:
adaptively updating, using a decoder, an Exponential-Golomb (EG) parameter according to a value of at least one binary string in a bitstream, wherein the binary string was encoded based on a value of at least one encoded prediction residual value when a prediction residual value difference (X−3) is greater than or equal to a maximum value of a truncated unary code (TU) plus one (M+1); and
decoding, using the decoder, a binary string in a lossless mode using an Exponential-Golomb (EG) code with the EG parameter.

22. The method of claim 21, wherein the EG parameter is adaptively updated by:
incrementing a counter by a number of at least one prediction residual that was decoded using the value of the EG parameter; and
updating an accumulator using a sum of received coded values.

* * * * *

UNITED STATES PATENT AND TRADEMARK OFFICE
CERTIFICATE OF CORRECTION

PATENT NO. : 9,277,211 B2
APPLICATION NO. : 13/868050
DATED : March 1, 2016
INVENTOR(S) : Wen Gao et al.

It is certified that error appears in the above-identified patent and that said Letters Patent is hereby corrected as shown below:

On the Title Page 2, column 2, line 17, References Cited, Other Publications:

Delete "Gai, W., et al., "A Lossless Coding Solution for HEVC," Joint Collaborative Team on Video Coding (JCT-VC), JCTVC-G664r1, Nov. 21-30, 2011, 14 pages." and insert -- Gao, W., et al., "A Lossless Coding Solution for HEVC," Joint Collaborative Team on Video Coding (JCT-VC), JCTVC-G664r1, Nov. 21-30, 2011, 14 pages. --

Signed and Sealed this
Twelfth Day of July, 2016

Michelle K. Lee
*Director of the United States Patent and Trademark Office*